United States Patent [19]

Hatch et al.

[11] Patent Number: 4,629,999

[45] Date of Patent: Dec. 16, 1986

[54] PHASE-LOCKED LOOP CAPABLE OF GENERATING A PLURALITY OF STABLE FREQUENCY SIGNALS

[75] Inventors: Douglas J. Hatch, Chittenango; Jeffrey L. Cox, Syracuse, both of N.Y.

[73] Assignee: North American Philips Corp., New York, N.Y.

[21] Appl. No.: 565,956

[22] Filed: Dec. 27, 1983

[51] Int. Cl.⁴ ............................................. H03B 7/00
[52] U.S. Cl. ...................................... 331/1 R; 331/17; 331/46
[58] Field of Search ............... 331/1 A, 25, 46, 50, 331/17

[56] References Cited

U.S. PATENT DOCUMENTS 3,729,688  4/1973  Cerny, Jr. et al. .................... 331/25
4,510,461  4/1985  Dickes et al. ......................... 331/17

Primary Examiner—Eugene La Roche
Assistant Examiner—G. Wan

[57] ABSTRACT

A phase-locked loop capable of generating a plurality of stable frequncy signals. This loop includes a plurality of voltage controlled oscillators which are sequentially coupled to the output of a phase sensitive detector by a multiplexer. RF switches then sequentially couple, in synchronism with the multiplexer, the oscillator outputs to a programmable divider which, in turn, is coupled to an input of the phase sensitive detector, the other input thereto being coupled to a reference oscillator. The dividing factors for the programmable divider are inputted thereto, in synchronism with the multiplexer, from a memory.

8 Claims, 2 Drawing Figures

PHASE-LOCKED LOOP CAPABLE OF GENERATING A PLURALITY OF STABLE FREQUENCY SIGNALS

BACKGROUND OF THE INVENTION

The invention relates to a phase-locked loop having a phase sensitive detector, a fixed frequency oscillator coupled to a first input of the phase sensitive detector, and variable oscillator means coupled to an output of the phase sensitive detector, the variable oscillator means having an output at which a stable frequency signal may be obtained, which output is also coupled to a second input of the phase sensitive detector.

Phase-locked loops of the above type are used, for example, in television transmission systems for generating a stable frequency signal by synchronizing the phase of the output frequency signal with the phase of a signal from a reference oscillator. In the case where a second stable frequency signal is desired, this phase-locked loop is duplicated using appropriate frequency division factors to obtain the desired frequency signals. When additional stable frequency signals are desired, the phase-locked loop is again duplicated therefor.

It should be apparent that this duplication of the phase-locked loop can substantially add to the cost of the equipment especially when several stable frequency signals are desired.

SUMMARY OF THE INVENTION

It is an object of this invention to provide a single phase-locked loop capable of generating a plurality of stable frequency signals. A phase-locked loop of the above type is therefore characterized in that the variable oscillator means comprises N variable oscillators having N respective outputs, where N is an integer greater than 1, the phase-locked loop further comprising first means for alternatively coupling the output of the phase sensitive detector to the N variable oscillators, means coupled to the second input of the phase sensitive detector for determining, respectively, the frequency of the signal at each of the N variable oscillator outputs, and second means for alternatively coupling the N variable oscillator outputs to the frequency determining means in synchronism with the first coupling means.

The result of the invention is a single phase-locked loop which is sequenced through the various desired stable frequency signals and with which, at any time, any of the stable frequency signals may be obtained.

DESCRIPTION OF THE DRAWINGS

The invention will now be described, by way of example, with reference to the accompanying drawings in which.

DESCRIPTION OF THE PREFERRED EMBODIMENT

Figure 1:
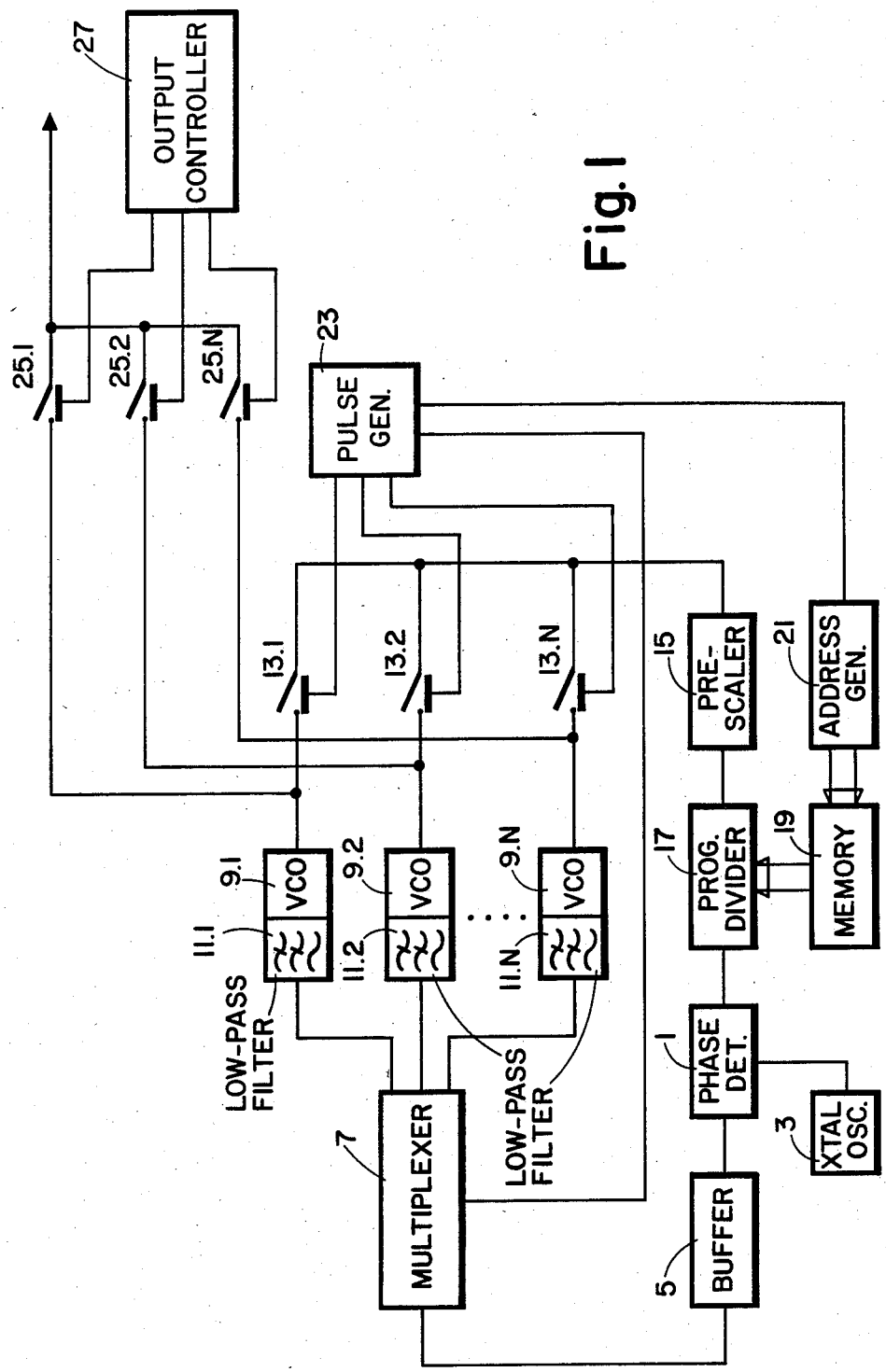
FIG. 1 is a block schematic diagram of a phase-locked loop in accordance with the invention.

The phase-locked loop shown in FIG. 1 includes a phase sensitive detector 1 having a crystal oscillator 3 connected to one input thereof. The output of the detector 1 is connected through a buffer 5 to the input of a multiplexer 7 having N outputs and a switching input. The N outputs are connected, respectively, to N voltage controlled oscillators 9.1, 9.2 and 9.N. Low-pass filters 11.1, 11.2 and 11.N are connected, respectively, between the outputs of the multiplexer 7 and the voltage controlled oscillators 9.1, 9.2 and 9.N to remove any switching noises generated by the multiplexer 7 from the signals at the outputs thereof. Controllable RF switches 13.1, 13.2 and 13.N, on the one hand, are coupled, respectively, to the outputs of the voltage controlled oscillators 9.1, 9.2 and 9.N, while, on the other hand, are interconnected and connected through a prescaler 15 to a programmable divider 17 which, in turn, is connected to the second input of the phase sensitive detector 1.

The programmable divider 17 receives the appropriate dividing factor from an addressable memory 19 which has stored therein at separate addresses, N dividing factors for determining the output frequencies of the voltage controlled oscillators 9.1, 9.2 and 9.N. An address generator 21 is connected to the address input of the memory 19 and generates, in response to a control signal, the addresses for the various dividing factors in sequence with the switching of the multiplexer 7. Finally, a pulse generator 23 is provided to generate the control signals for the RF switches 13.1, 13.2 and 13.N and the address generator 21 as well as the switching signal for the multiplexer 7.

Figure 2:
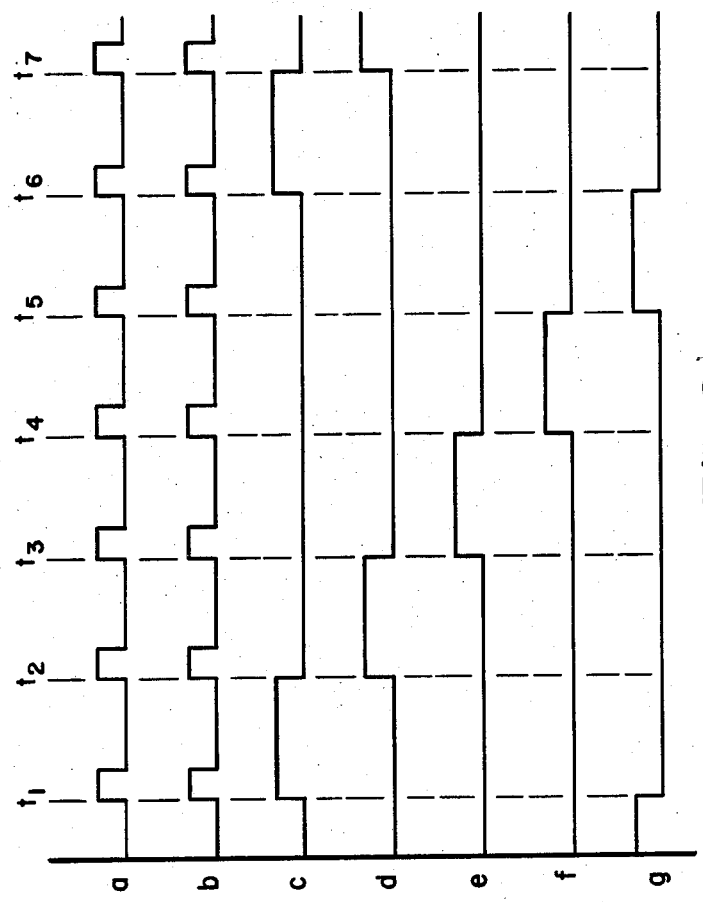
FIG. 2 is waveform diagram showing the control signals in the phase-locked loop.

Referring to FIG. 2, the operation of the phase-locked loop will now be described assuming that N equals 5. In FIG. 2, line a represents the switching signal to the multiplexer 7, line b represents the control signal to the address generator 21 and lines c-g represent the control signals to RF switches 3.1-13.5. At time $t_1$, the multiplexer 7 couples the input thereto to voltage controlled oscillator 9.1, while RF switch 13.1 is energized coupling the output of voltage controlled oscillator 9.1 to the programmable divider 17. At the same time, the control signal of line b causes the address generator 21 to generate the address of the first dividing factor which is loaded into the programmable divider 17 by the memory 19. After allowing sufficient time for the loop to stabilize, at time $t_2$, the multiplexer 7 switches its input signal to voltage controlled oscillator 9.2, RF switch 13.1 opens and RF switch 13.2 closes, now coupling voltage controlled oscillator 9.2 to the programmable divider 17, which is now loaded with the next dividing factor as determined by the memory 19 and the address generator 21 which receives the control signal of line b. This mode of operation is repeated for voltage controlled oscillators 9.3, 9.4 and 9.5 at times $t_3$, $t_4$ and $t_5$, respectively. At time $t_6$, the cycle repeats itself with voltage controlled oscillator 9.1. It should be noted that when any particular voltage controlled oscillator 9.N is not coupled in the loop, it is allowed to run freely. Over time, the free running voltage controlled oscillators 9.N may drift away from the desired respective frequencies. However, by selecting a sufficiently rapid sequence recycling time, the drift of each voltage controlled oscillator 9.N may be minimized.

In order to selectively access each of the outputs of the voltage controlled oscillators 9.N, the phase-locked loop is further provided with N additional controllable RF switches 25.1, 25.2 and 25.N each having one end respectively coupled to the respective voltage controlled oscillators 9.N output, the other ends thereof being interconnected to form a common loop output. A user operable output controller 27 is connected to the control inputs of the RF switches 25.N for selectively applying the outputs of the voltage controlled oscillators 9.N to the common output.

Numerous alterations of the structure herein disclosed will suggest themselves to those skilled in the art. However, it is to be understood that the present disclosure relates to a preferred embodiment of the invention which is for purposes of illustration only and not to be construed as a limitation of the invention. All such modifications which do not depart from the spirit of the invention are intended to be included within the scope of the appended claims.

We claim:

1. A phase-locked loop having a phase sensitive detector, a fixed frequency oscillator coupled to a first input of said phase sensitive detector, and variable oscillator means coupled to an output of said phase sensitive detector, said variable oscillator means having at least one output at which a stable frequency signal may be obtained, which output is coupled to a second input of said phase sensitive detector; characterized in that said variable oscillator means comprises N variable oscillators having N respective outputs, where N is an integer greater than 1; said phase-locked loop further comprising first means for alternatively coupling the output of said phase sensitive detector to said N variable oscillators, means coupled to the second input of said phase sensitive detector for determining, respectively, the frequency of the signal at each of said N variable oscillator outputs, and second means for alternatively coupling said N variable oscillator outputs to said frequency determining means in synchronism with said first coupling means.

2. A phase-locked loop as claimed in claim 1, characterized in that said first coupling means comprises a multiplexer having N outputs for sequentially coupling the output of said phase sensitive detector to each of said N variable oscillators.

3. A phase-locked loop as claimed in claim 2, characterized in that said loop further comprises N low-pass filters coupled, respectively, between said multiplexer N outputs and said N variable oscillators.

4. A phase-locked loop as claimed in claim 1, characterized in that said second coupling means comprises N controllable RF switches coupled, respectively, to said N variable oscillator outputs, and means for alternatively closing said RF switches in synchronism with said first coupling means.

5. A phase-locked loop as claimed in claim 1, characterized in that said frequency determining means comprises a programmable divider and a memory coupled thereto for providing the dividing factor for each of said N variable oscillators.

6. A phase-locked loop as claimed in claim 1, characterized in that said first coupling means comprises a multiplexer having a switching input and N outputs for sequentially coupling the output of said phase sensitive detector to each of said N variable oscillators; said second coupling means comprises N RF switches, each having a control input, and said frequency determining means comprises a programmable divider and a memory coupled thereto for providing the dividing factor for each of said N variable oscillators, said memory having an address generator coupled thereto for generating, in sequence, the addresses of said dividing factors in response to a signal applied to a control input thereof; said phase-locked loop further comprising a control signal generator having outputs coupled, respectively, to said multiplexer switching input, the control inputs of said RF switches and said address generator control input, for causing said multiplexer to sequentially apply the output of said phase sensitive detector to said N variable oscillators, sequentially closing and opening said RF switches in synchronism with said multiplexer switching such that said phase-locked loop remains closed, and causing said address generator to output the address of the dividing factor for the selected one of said N variable oscillators.

7. A phase-locked loop as claimed in claim 6, characterized in that said loop further comprises N low-pass filters coupled, respectively, between said multiplexer N outputs and said N variable oscillators.

8. A phase-locked loop as claimed in claim 6, characterized in that said loop further comprises N additional RF switches having inputs coupled, respectively, to said N variable oscillator outputs, said N additional RF switches having outputs coupled one to the other forming a single loop output, and N control inputs; and means coupled to said N control inputs for selecting one of said N variable oscillator outputs to be obtainable at said loop output.

* * * * *